(12) United States Patent
Parker et al.

(10) Patent No.: US 7,231,552 B2
(45) Date of Patent: Jun. 12, 2007

(54) METHOD AND APPARATUS FOR INDEPENDENT CONTROL OF DEVICES UNDER TEST CONNECTED IN PARALLEL

(75) Inventors: Rachael J. Parker, Forest Grove, OR (US); Gregory M. Iovino, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 442 days.

(21) Appl. No.: 10/280,458

(22) Filed: Oct. 24, 2002

(65) Prior Publication Data

US 2004/0083414 A1    Apr. 29, 2004

(51) Int. Cl.
G06F 11/00    (2006.01)
(52) U.S. Cl. .................... 714/30; 324/764; 702/118
(58) Field of Classification Search .............. 714/30, 714/726, 727, 729, 725; 326/16
See application file for complete search history.

(56) References Cited

U.S. PATENT DOCUMENTS

| | | | | |
|---|---|---|---|---|
| 5,325,368 A | * | 6/1994 | James et al. ................. | 714/727 |
| 5,493,683 A | * | 2/1996 | Cloud et al. ................. | 713/320 |
| 5,537,562 A | * | 7/1996 | Gallup et al. ................ | 712/234 |
| 5,574,730 A | * | 11/1996 | End et al. .................... | 714/724 |
| 5,623,500 A | * | 4/1997 | Whetsel, Jr. ................. | 714/724 |
| 5,671,435 A | * | 9/1997 | Alpert ......................... | 712/38 |
| 5,675,825 A | * | 10/1997 | Dreyer et al. ................. | 712/42 |
| 5,838,901 A | * | 11/1998 | Curd et al. ................... | 713/200 |
| 6,032,279 A | * | 2/2000 | Ramamurthy et al. ...... | 714/727 |
| 6,065,113 A | * | 5/2000 | Shiell et al. ................. | 712/227 |
| 6,158,032 A | * | 12/2000 | Currier et al. .............. | 714/726 |
| 6,161,213 A | * | 12/2000 | Lofstrom ...................... | 716/4 |
| 6,378,093 B1 | | 4/2002 | Whetsel | |
| 6,405,335 B1 | | 6/2002 | Whetsel | |
| 6,560,734 B1 | * | 5/2003 | Whetsel ...................... | 714/724 |
| 6,581,190 B1 | * | 6/2003 | Dixon et al. .................. | 716/4 |
| 6,618,827 B1 | * | 9/2003 | Benavides ................... | 714/726 |
| 6,711,708 B1 | * | 3/2004 | Shimomura ................. | 714/727 |
| 6,717,429 B2 | * | 4/2004 | Whetsel ...................... | 324/765 |
| 6,766,486 B2 | * | 7/2004 | Neeb ........................... | 714/724 |
| 6,988,232 B2 | * | 1/2006 | Ricchetti et al. ............ | 714/736 |
| 7,058,856 B2 | * | 6/2006 | Shinmori ..................... | 714/30 |
| 2002/0083387 A1 | * | 6/2002 | Miner et al. ................. | 714/726 |
| 2003/0009715 A1 | * | 1/2003 | Ricchetti et al. ............ | 714/727 |
| 2003/0018944 A1 | * | 1/2003 | Chae et al. ................... | 716/4 |
| 2003/0120987 A1 | * | 6/2003 | Savaria et al. .............. | 714/726 |
| 2003/0126533 A1 | * | 7/2003 | McAdams .................... | 714/727 |
| 2003/0177373 A1 | * | 9/2003 | Moyer et al. ................ | 713/189 |

* cited by examiner

Primary Examiner—Robert Beausoliel
Assistant Examiner—Philip Guyton
(74) Attorney, Agent, or Firm—Blakely, Sokoloff, Taylor & Zafman LLP

(57) ABSTRACT

A JTAG-compatible device includes a unique identifier stored in dedicated non-volatile memory, a test access port (TAP) controller, a TAP instruction register, a dedicated data register, and a comparison block. The TAP instruction register enables and/or disables TAP instruction execution by the device. The dedicated data register is of a length that is the same or a subset of the length of the unique identifier. The comparison block can be an arithmetic logic unit (ALU) or other circuitry that compares a code scanned into the dedicated data register with the unique identifier stored in a PROM. The TAP controller can selectively ignore TAP commands if a code scanned into dedicated data register does not match the stored unique identifier. This allows the TAP controller to conditionally or independently control several devices that are connected in parallel. The unique identifier can be device-specific, device type-specific, and/or device configuration specific.

26 Claims, 6 Drawing Sheets

METHOD AND APPARATUS FOR INDEPENDENT CONTROL OF DEVICES UNDER TEST CONNECTED IN PARALLEL

FIELD OF THE INVENTION

The invention is related to integrated circuits, and in particular, to independent control and test of integrated circuits.

BACKGROUND INFORMATION

When products are sold to original equipment manufacturers (OEMs), the products are usually accompanied by device specifications. The specifications typically include acceptable operating conditions, connection recommendations, direct current (DC) specifications, and alternating current (AC) specifications. The device is commonly expected to perform according to the specifications.

Product manufacturers perform certain tests on the devices in order to guarantee the product complies with the specifications. A group of key electronic companies proposed a technique whereby integrated circuits (i.e., chips) on a printed circuit board could be tested easily by incorporating software-controlled hardware into the integrated circuit during manufacturing. This technique was approved by the well known Institute of Electrical and Electronics Engineers (IEEE) as IEEE Standard 1149.1-1990. Because the group of key electronic companies was known as the Joint Test Action Group, the terms "IEEE Standard 1149.1" and "JTAG Standard" often are used interchangeably.

The IEEE 1149.1 or JTAG Standard specifies the hardware and software needed to enable testing of chips. The JTAG Standard provides for a test access port architecture for testing chips.

Typically, integrated circuits are manufactured and tested in large volumes via a test access port (TAP) or multiple TAPs. Prior to performing certain tests, several integrated circuits may be chained together via the interfaces of their respective TAPs). Alternatively, multiple input pins on a single integrated circuit may be tested through the TAP interface of the integrated circuit under test. As is well known, each TAP interface has four (or optionally five) pins, any one of which may be referred to as a "boundary pin" or a "test access pin." A test clock (TCK) pin receives a test clock signal for the device under test. A test mode select (TMS) pin accepts commands to select particular test modes. A test data in (TDI) pin accepts data into the device under test. A test data output (TDO) pin sends data out from the device under test.

In many integrated circuits, fuses or other non-volatile memory are used to store information or identification, form connections for redundancy, configuration, etc. For example, fuses can be "blown" or "programmed" in a pattern to indicate the state of the integrated circuit (e.g., operating frequency, bus ratio, cache repair status, etc.).

Sometimes testing several integrated circuits in parallel can be problematic. For example, it can be difficult to independently read and control individual devices connected in parallel. One solution is to connect the devices in parallel except that each device has its own TDO and TDI that are read out individually. This method requires separate control interfaces and connections to and from each device, however, and therefore is cumbersome and inefficient.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number.

DETAILED DESCRIPTION OF ILLUSTRATED EMBODIMENTS

In the following description, numerous specific details, such as particular processes, materials, devices, and so forth, are presented to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring various embodiments of the present invention.

Some parts of the description will be presented using terms such as programmable read only memory (PROM), register, instruction, device under test (DUT), and so forth. These terms are commonly employed by those skilled in the art to convey the substance of their work to others skilled in the art.

Various operations will be described as multiple discrete blocks performed in turn in a manner that is most helpful in understanding the invention. However, the order in which they are described should not be construed to imply that these operations are necessarily order dependent or that the operations be performed in the order in which the blocks are presented.

Reference throughout this specification to "one embodiment" or "an embodiment" means that a particular feature, structure, process, block, or characteristic described in connection with the embodiment of the present invention is included in at least one embodiment of the present invention. Thus, the appearances of the phrases "in one embodiment of the present invention" or "in an embodiment of the present invention" in various places throughout this specification are not necessarily all referring to the same embodiment of the present invention. Furthermore, the particular features, structures, or characteristics may be combined in any suitable manner in one or more embodiments of the present invention.

Figure 1:
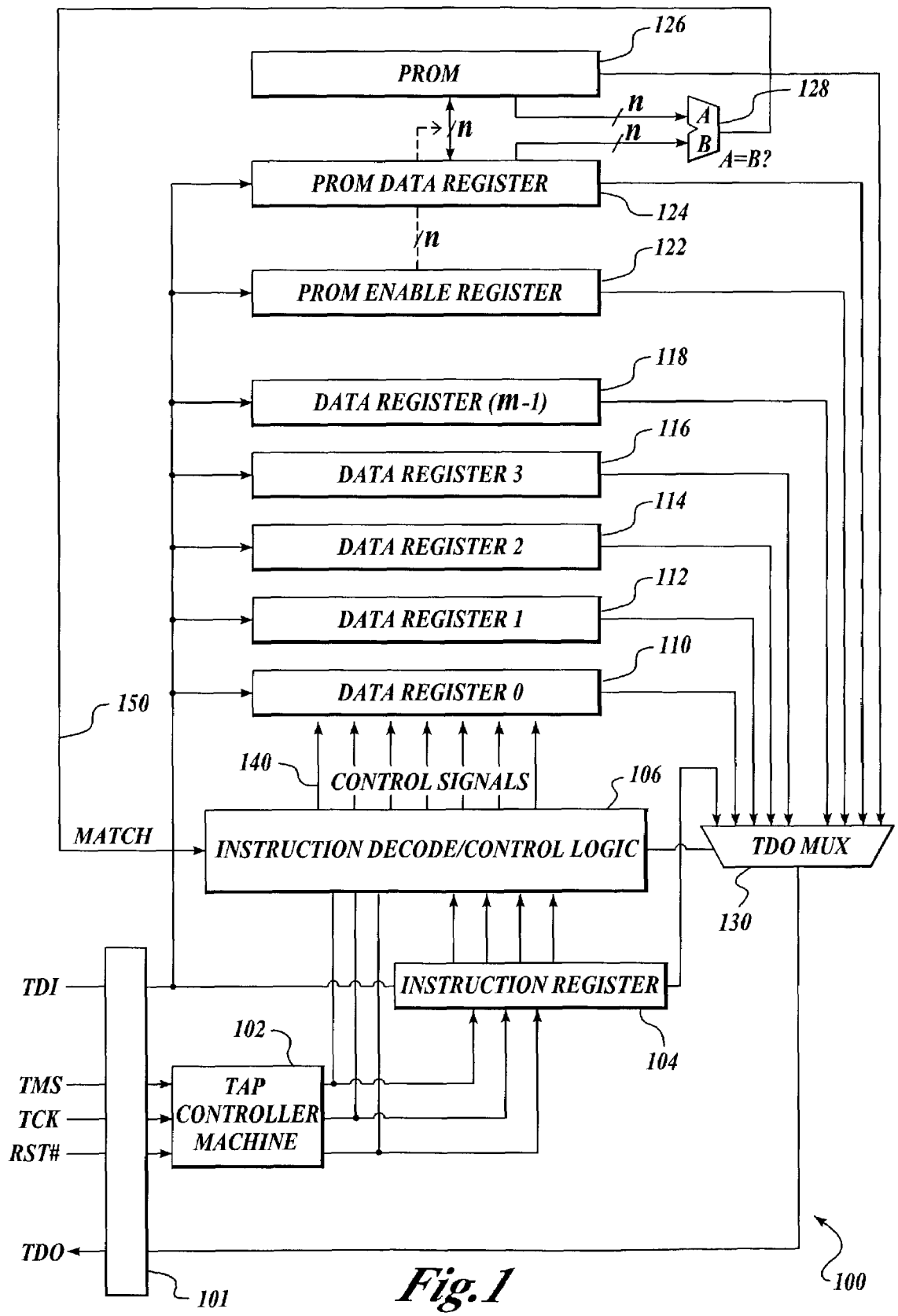
FIG. 1 is a high-level block diagram of an integrated circuit according to an embodiment of the present invention.

FIG. 1 is a high-level block diagram of a portion of a JTAG compatible device 100 according to embodiments of the present invention. The example device 100 includes a TAP port 101, which includes a test clock (TCK) pin, a test mode select (TMS) pin, a test reset (RST#) pin, a test data in (TDI) pin, and a test data out (TDO) pin. The TCK pin receives a test clock signal for the device under test. The TMS pin receives a signal to control sequencing of the TAP Controller Machine 102. The RST# pin receives a signal to initialize the device 100 to a known state. Data (e.g., patterns) are scanned into the device 100 through the TDI pin and scanned out of the device 100 through the TDO pin.

The device 100 also includes a TAP controller machine 102, an instruction register 104, instruction decode/control logic 106, several data registers 110, 112, 114, 116 and 118, a programmable read only memory device (PROM) 126, a PROM data register 124, a compare block 128, a TDO multiplexer (mux) 130, and an optional PROM enable register 122. The TAP port 101 is coupled to the TAP controller machine 102, the data registers 110, 112, 114, 116 and 118, the PROM enable register 122, the PROM data register 124, and the TDO mux 130. Although this embodiment has five data registers, other embodiments may have different numbers of data registers.

The TAP controller machine 102 is coupled to the instruction register 104 and the instruction decode/control logic 106. The instruction register 104 is coupled to the instruction decode/control logic 106 and the TDO mux 130. The instruction decode/control logic 106 is coupled to the data registers 110, 112, 114, 116 and 118, the PROM enable register 122, the PROM data register 124, the PROM 126, and other device 100 circuitry (not shown). The PROM enable register 122 is coupled to the PROM data register 124. The PROM data register 124 is coupled to the PROM 126. The PROM data register 124 and the PROM 126 are coupled to the compare block 128, which is coupled to the instruction decode/control logic 106. Control signals 140 are coupled between the instruction decode/control logic 106 and the data registers 110, 112, 114, 116 and 118. A match signal line 150 is coupled between the compare block 128 and the instruction decode/control logic 106.

The device 100 may be a microprocessor, microcontroller, programmable logic display (PLD), static random access memory (SRAM), field programmable gate array (FPGA), an application specific integrated circuit (ASIC), or any other discrete device that is compatible with the JTAG Standard.

The TAP controller machine 102 is part of standard JTAG architecture. After reading the description herein, persons of ordinary skill in the relevant art(s) will readily recognize how to implement embodiments of TAP controller machine 102.

The instruction register 104 is part of standard JTAG architecture. In one embodiment, the instruction register 104 stores instructions to enable and/or disable TAP instruction execution by the device 100. For example, the instruction register 104 can pass an instruction to the instruction decode/control logic 106. After reading the description herein, persons of ordinary skill in the relevant art(s) will readily recognize how to implement embodiments of the instruction register 104.

The instruction decode/control logic 106 is TAP instruction execution enabling and disabling logic. In one embodiment of the present invention, the instruction decode/control logic 106 enables and/or disables data scanning into the PROM data register 124 and/or the PROM enable register 122. The several data registers 110, 112, 114, 116 and 118 are part of standard JTAG architecture. After reading the description herein, persons of ordinary skill in the relevant art(s) will readily recognize how to implement embodiments of the data registers 110, 112, 114, 116 and 118.

The PROM 126, although illustrated as a programmable read only memory device, may be any dedicated non-volatile memory, such as a fuse array, EPROM, and/or Flash memory. The PROM 126 has a predetermined length. In one embodiment of the present invention, the PROM 126 stores a code (e.g., a pattern of "ones" and "zeros"). For example, to store the code, fuses may be blown or other non-volatile memory may be programmed in a pattern. The code may include one or more fields, any of which (i.e., code and/or field) may or may not be unique.

One or more fields in a code may include bits that identify a particular device (e.g., one or more devices implemented according to embodiments of the present invention). One or more fields may include bits that identify a particular type of device, such as one or more microprocessors, microcontrollers, PLDs, SRAMs, FPGAs, ASICs, or any other discrete device. One or more fields may include bits that identify a particular device configuration, such as bus ratio, operating frequency, cache repair status, etc. Of course, one or more fields may include bits that identify any other distinguishable device variable and after reading the description herein, persons of ordinary skill in the relevant art(s) will readily recognize how to implement embodiments of the PROM 126.

The PROM data register 124 may be a dedicated user-defined TAP register of a predetermined length. The length of the PROM data register 124 may be the same as or a subset of the length of the PROM 126. In one embodiment of the present invention, the PROM data register 124 receives a bit pattern scanned in through the TDI pin. After reading the description herein, persons of ordinary skill in the relevant art(s) will readily recognize how to implement embodiments of the PROM data register 124.

The compare block 128 may be a real-time comparator, such as an arithmetic logic unit (ALU) or other logic circuit to execute a TAP "compare" instruction. In one embodiment of the present invention, the comparing block 128 compares data in the PROM 126 with data in the PROM data register 124 and asserts a signal on the match signal line 150 if the data matches. The compared data may be a code or one or more fields of a code. After reading the description herein, persons of ordinary skill in the relevant art(s) will readily recognize how to implement embodiments of the PROM data register 124.

When the match signal is asserted on the match signal line 150, the instruction decode/control logic 106 can use this signal to permit the device 100 to execute one or more subsequent TAP instructions scanned into the device 100, until the match signal on the match signal line 150 is de-asserted. When the match signal on the match signal line 150 is de-asserted, the instruction decode/control logic 106 can use this signal to disable execution of subsequent TAP instructions by the device 100.

The TDO multiplexer (mux) 130 is part of the standard JTAG architecture. In one embodiment of the present invention, the TDO mux 130 selects and outputs data from the PROM 126, the PROM data register 124, the PROM enable register 122, and/or the data registers 110, 112, 114, 116 and 118. The TDO mux 130 may receive (data, commands, control signals) inputs from the instruction decode/control logic 106 and/or the instruction register 104. After reading the description herein, persons of ordinary skill in the relevant art(s) will readily recognize how to implement embodiments of the TDO mux 130.

The control signals 140 are part of standard JTAG architecture. The control signals 140 are data register dependent, although not so depicted, as is well known. For instance, the control signals 140 do not necessarily go to all data registers 110, 112, 114, 116 and 118 in common. Some of the control signals may control the PROM 126 but not others. The TAP instructions scanned into the instruction register 104 determine which control signals 140 are asserted. After reading the description herein, persons of ordinary skill in the relevant art(s) will readily recognize how to implement embodiments of the control signals 140.

The device 100 can selectively ignore TAP instructions if a code scanned into the PROM data register 124 does not match the code stored in the PROM 126. Because the device 100 can selectively ignore TAP instructions, the device 100 can be conditionally controlled when several devices implemented according to embodiments of the present invention are connected in parallel. Further, the device 100 can be Independently controlled if PROM data is unique.

In one embodiment of the present invention, the device 100 may implement a bit-selective "read" from the PROM 126 into the PROM data register 124 by using the PROM enable register 122 to mask one or more bits that should not be read from the PROM 126 into the PROM data register 124. In this embodiment, the comparing block 128 may in effect compare any subset of bits from the PROM 126 with the corresponding field(s) scanned into the PROM data register 124.

The PROM enable register 122 may be a dedicated user-defined TAP register of a predetermined length. The length of the PROM enable register 122 may be the same or a subset of the length of the PROM 126. In one embodiment of the present invention, the PROM enable register 122 receives a bit pattern scanned in through the TDI pin. After reading the description herein, persons of ordinary skill in the relevant art(s) will readily recognize how to implement embodiments of the PROM data register 124.

Figure 2:
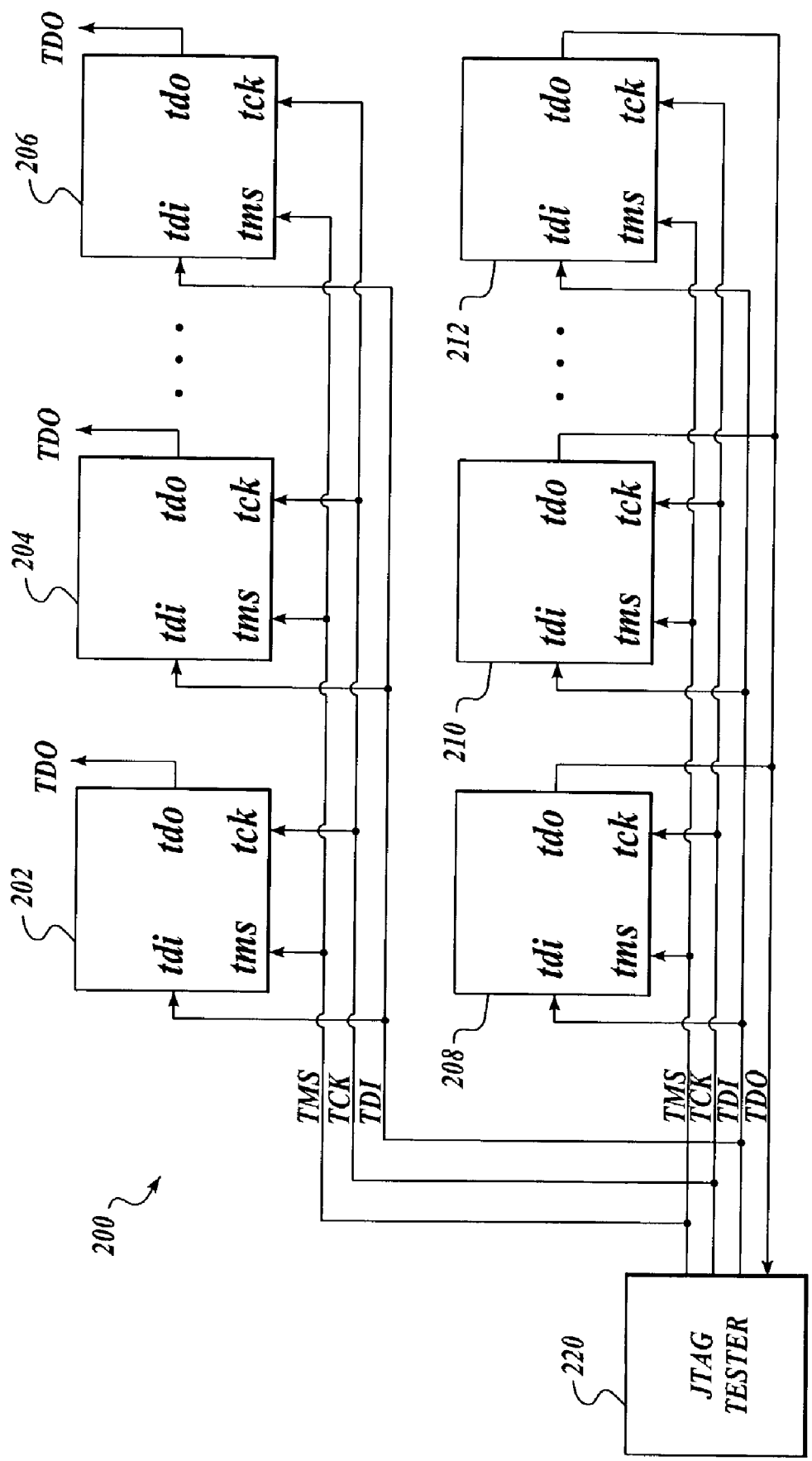
FIG. 2 is a high-level block diagram of a test environment suitable for implementing embodiments of the present invention.

FIG. 2 is a high-level block diagram of an example test environment 200 according to an embodiment of the present invention. The test environment 200 includes several JTAG compatible devices similar to the device 100. However, for ease of explanation the devices are numbered 202, 204, 206, 208, 210 and 212. The test environment 200 also includes a JTAG tester 220. In one embodiment, the tester 220 is any well-known, off-the-shelf JTAG tester capable of scanning data into and out of the TAP ports of the devices 202, 204, 206, 208, 210 and 212. The devices 202, 204 and 206 are coupled together and to the tester 220 such that TAP ports access each TDO pin independently of any other TDO pin. The devices 208, 210 and 212 are coupled together and to the tester 220 such that the TAP ports are connected in common.

For purposes of explanation, assume that a code is stored in each of the devices 202, 204, 206, 208, 210 and 212. Table 1 below shows the devices 202, 204, 206, 208, 210, 212, and example codes stored in the non-volatile memories of the devices 202, 204, 206, 208, 210 and 212.

TABLE 1

| DEVICE | ID | DEVICE TYPE | BUS RATIO | CACHE REPAIR STATUS |
|---|---|---|---|---|
| 202 | 00000000 | 0000 | 0000 | 0001 |
| 204 | 00000001 | 1000 | 0001 | 0000 |
| 206 | 00000010 | 0000 | 0000 | 0001 |
| 208 | 00000011 | 1000 | 0001 | 0000 |
| 210 | 00000100 | 0000 | 0000 | 0001 |
| 212 | 00000101 | 1000 | 0001 | 0000 |

Each DEVICE ID field includes unique patterns that identify the specific devices 202, 204, 206, 208, 210 or 212. The DEVICE TYPE fields include patterns that identify a particular type of device. Note that the DEVICE TYPE fields indicate that devices 202, 206 and 210 are the same type of device, and that the devices 204, 208 and 212 are the same type of device. The BUS RATIO fields include patterns that indicate the bus ratio of the devices 202, 206 and 210 are the same and that the bus ratio of the devices 204, 208 and 212 are the same. The CACHE REPAIR STATUS fields include patterns that indicate the cache repair status of the devices 202, 206 and 210 are the same and that the cache repair status of the devices 204, 208 and 212 are the same. Of course, other code fields are possible and after reading the description herein, persons of ordinary skill in the relevant art(s) could readily implement embodiments of the present invention using other fields.

Figure 3:
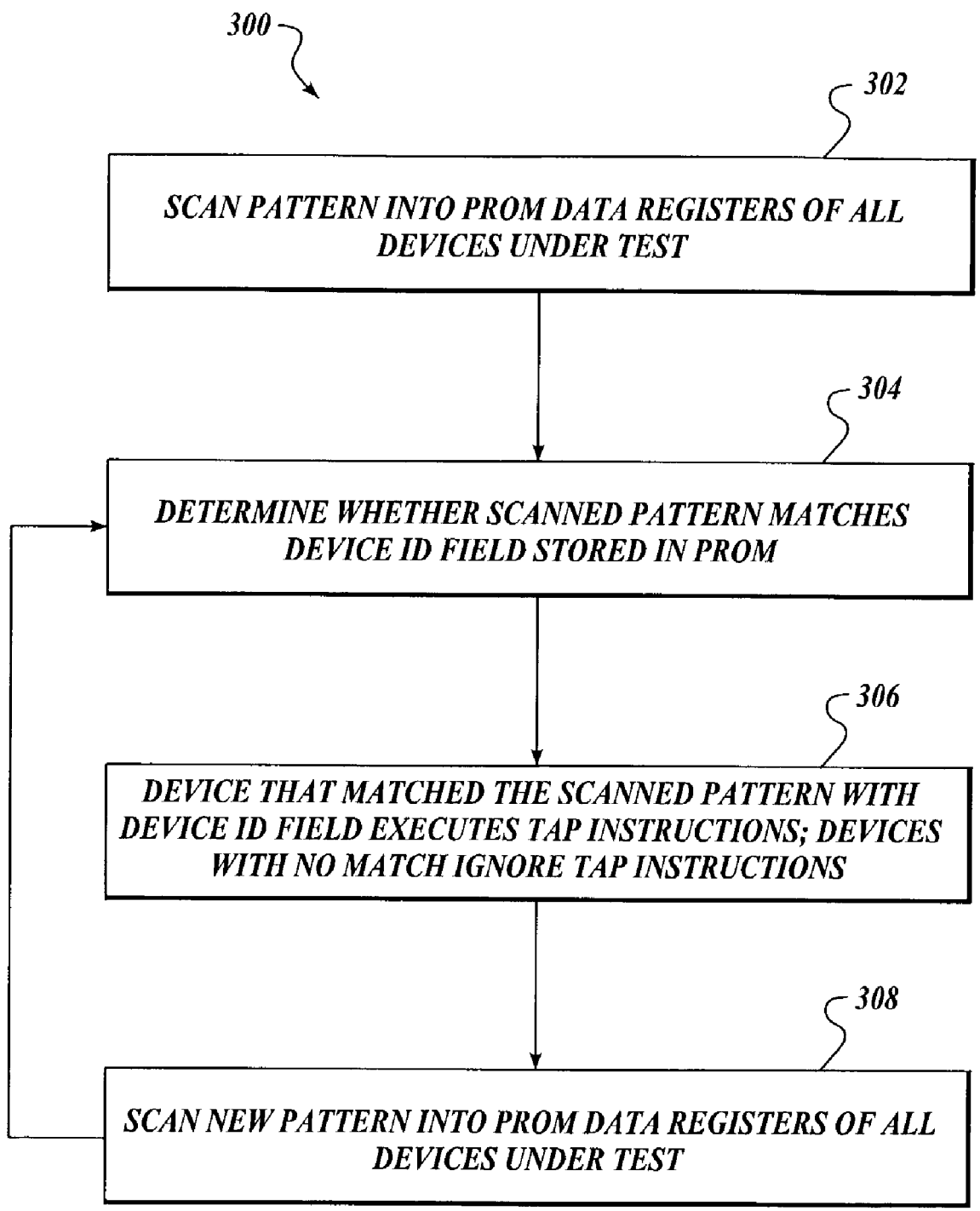
FIG. 3 is a flowchart illustrating an approach to testing an integrated circuit according to an embodiment of the present invention.

FIG. 3 is a flowchart of a process 300 that may be implemented using a JTAG compatible device according to embodiments of the present invention. The example process 300 may be used to control a specific JTAG compatible device (e.g., the device 202, 204, 206, 208, 210 or 212 of FIG. 2). A machine-readable medium with machine-readable instructions thereon may be used to cause a processor to perform the process 300. Referring to FIGS. 1–3, this embodiment of process 300 is performed as follows.

In a block 302, a code is scanned into the PROM data registers 124 of all devices under test in parallel through the TAP port 101. In one embodiment, the code "00000000000000000001" is scanned into the PROM data register 124 for each device 202, 204, 206, 208, 210 and 212 via the TDI pin. Note that the pattern of DEVICE ID field of the scanned code "00000000000000000001" corresponds to the pattern stored in the DEVICE ID field of PROM 126 of the device 202. Of course, other codes may be scanned into the PROM data registers 124 of the devices 202, 204, 206, 208, 210 and 212 that have patterns in the DEVICE ID field that correspond to the pattern stored in the DEVICE ID fields of the PROMs 126 of the other devices 206, 206, 208, 210 or 212.

In a block 304, each device under test determines whether the scanned code has a pattern that matches the DEVICE ID field in its stored code. For example, the compare block 128 in each device 202, 204, 206, 208, 210 and 212 compares the pattern stored in the DEVICE ID field of its PROM 126 to the DEVICE ID field of the code "00000000000000000001" scanned into the PROM data registers 124. In one embodiment of the present invention, the pattern stored in the DEVICE ID field of the PROM 126 of the device 202 matches the pattern of the DEVICE ID field of the code "00000000000000000001" scanned into the PROM data register 124 of the device 202. However, the patterns stored in the DEVICE ID fields of the PROMs 126 of the devices 204, 206, 208, 210 and 212 do not match the pattern of the DEVICE ID field of the code "00000000000000000001" scanned into the PROM data registers 124 of the devices 204, 206, 208, 210 and 212.

In block 306, the device that has matched the scanned pattern with its DEVICE ID field executes the next set of TAP instructions that follow the scanned pattern and the devices that have not match the scanned pattern with its DEVICE ID field ignore the next set of TAP instructions that follow the scanned pattern. In one embodiment of the present invention, the device 202 executes the next set of TAP instructions that follow the scanned pattern because in this embodiment the pattern of the DEVICE ID field of the code "00000000000000000001" matches the pattern stored in the DEVICE ID field of the PROM 126 of the device 202. In addition, the devices 204, 206, 208, 210 and 212 ignore the next set of TAP instructions that follow the scanned pattern because the pattern of the DEVICE ID Field of the code "00000000000000000001" does not match the patterns stored in the DEVICE ID fields in the PROMs 126 of the devices 204, 206, 208, 210 and 212.

In a block 308, a new code can be scanned into the TAP instruction register 104 of all devices under test in parallel through the TAP port 101. For example, an exit command can be scanned into TAP instruction register 104 of each device 202, 204, 206, 208, 210 and 212 via the TDI pin. Alternatively, a new TAP instruction can also be scanned into TAP instruction register 104 in accordance with the JTAG standard. After the block 308 is performed, control of the process 300 can return to the block 302 and the process repeats.

Figure 3A:
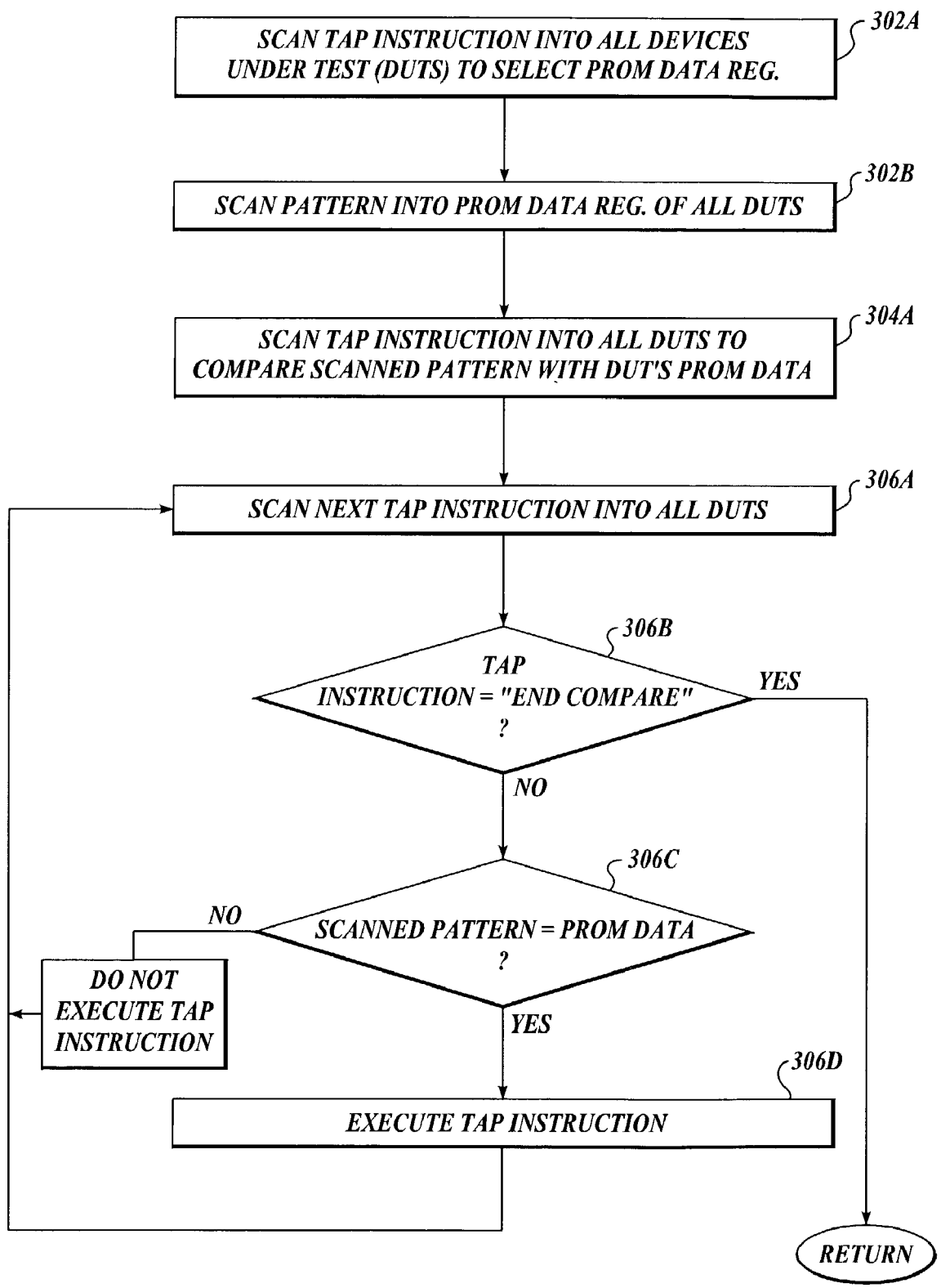
FIG. 3A is a flowchart illustrating the approach of FIG. 3 in more detail, according to one embodiment of the present invention.

FIG. 3A is a flowchart showing process 300 (FIG. 3) in more detail, according to one embodiment of the present invention. In this embodiment, all of the devices under test are connected in parallel. Referring to FIGS. 1 and 3A, this embodiment of process 300 is performed as follows.

In a block 302A, a TAP instruction is scanned into TAP instruction register 104 of each device under test. In this embodiment, this instruction is to configure each device under test to select its PROM data register 124 for loading.

In a block 302B, a pattern is scanned into the PROM Data register 124 of each device under test. This pattern corresponds to the DEVICE ID of the particular device to be tested.

In a block 304A, a TAP instruction is scanned into the instruction register 104 of each device under test. In this embodiment, the instruction is to compare the pattern scanned into the PROM Data register 124 with the data stored in a device's DEVICE ID Field. This configures the device into a compare mode. In this embodiment, this instruction is then executed and if the scanned pattern matches the device's DEVICE ID, the match signal on match signal line 150 is asserted.

In a block 306A, a next TAP instruction is scanned into the instruction register 104 of each device under test. For example, this next TAP instruction can cause the desired device under test to perform a selected test operation.

In a block 306B, this next TAP instruction is analyzed. If the next TAP instruction is an "END COMPARE" instruction, the operational flow proceeds to a RETURN operation. If not, the operational flow proceeds to a block 306C.

In block 306C, the scanned pattern in PROM Data Register 124 is compared to the DEVICE ID Field of the data stored in the PROM Data Registers 110–118. In this embodiment, instruction decode/control logic 106 (FIG. 1) performs this operation by detecting whether the match signal on match signal line 150 is asserted. If the match signal is not asserted, the operational flow loops back to block 306A without executing the TAP instruction (i.e., from the previously performed block 306A).

However, if the match signal is asserted, the operational flow proceeds to a block 306D. In block 306D, the device executes the TAP instruction stored in the instruction register 104 (from the previously performed block 306A). The operational flow then loops back to perform block 306A again. The operational flow from block 306A onwards is then repeated as described above.

Figure 4:
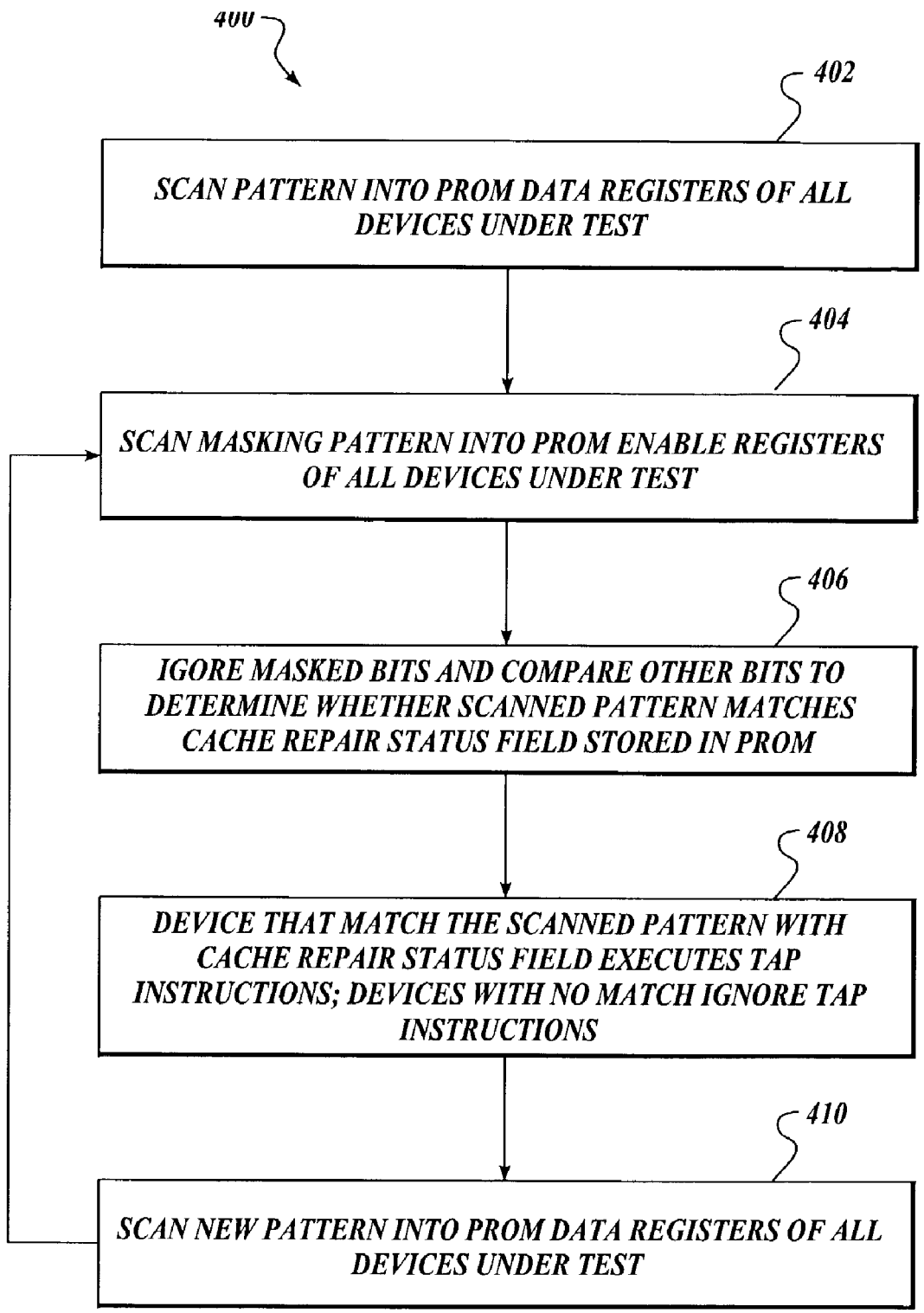
FIG. 4 is a flowchart illustrating an alternative approach to testing an integrated circuit according to an embodiment of the present invention.

FIG. 4 is a flowchart of a process 400 that may be implemented using a JTAG compatible device according to embodiments of the present invention. The example process 400 may be used to control one or more JTAG compatible devices (e.g., the devices 202, 204, 206, 208, 210 and/or 212 of FIG. 2) based on a particular device configuration (e.g., cache repair status), device type, or other distinguishable variable. For ease of explanation, the process 400 is described with reference to controlling one or more of the devices 202, 204, 206, 208, 210 and/or 212 based on cache repair status. A machine-readable medium with machine-readable instructions thereon may be used to cause a processor to perform the process 400. Referring to FIGS. 1, 2 and 4, this embodiment of process 400 is performed as follows.

In a block 402, a pattern is scanned into the PROM data registers 124 of all devices under test in parallel through the TAP port 101. In one embodiment, "xxxxxxxxxxxxxxxx0001" is scanned into the PROM data register 124 for each device 202, 204, 206, 208, 210 and 212 via the TDI pin. Note that the scanned pattern "xxxxxxxxxxxxxxxx0001" corresponds to the pattern stored in the CACHE REPAIR STATUS field of the devices 202, 206 and 210. Of course, other patterns may be scanned into the devices 202, 204, 206, 208, 210 and 212 that correspond to the pattern stored in the CACHE REPAIR STATUS fields, BUS RATIO fields, or the DEVICE TYPE fields of the one or more of the devices 202, 204, 206, 208, 210 and 212.

In a block 404, a masking pattern is scanned into the PROM enable registers 122 of all devices under test in parallel through the TAP port 101. In one embodiment, the code "00000000000000001111" is scanned into the PROM data register 124 for each device 202, 204, 206, 208, 210 and 212 via the TDI pin. In one embodiment of the present invention, the "0's" in the masking pattern correspond to bits in the PROM 126 that should be masked and the "1's" in the masking pattern correspond to bits in the PROM 126 that are not masked. In this embodiment, the DEVICE ID fields, BUS RATIO fields, and the DEVICE TYPE fields of the devices 202, 204, 206, 208, 210 and 212 are masked and the CACHE REPAIR STATUS fields of the devices 202, 204, 206, 208, 210 and 212 are not masked.

In a block 406, each device under test ignores the masked bits and compares the remaining bits to determine whether the scanned pattern matches the stored code. For example, the compare block 128 in each device 202, 204, 206, 208, 210 and 212 compares the code stored in the PROM 126 to "xxxxxxxxxxxxxxxx0001" scanned into the PROM data registers 124. In one embodiment of the present invention, the codes stored in the DEVICE ID fields, BUS RATIO fields, and the DEVICE TYPE fields of the devices 202, 204, 206, 208, 210 and 212 are masked. Consequently, only the codes stored in the CACHE REPAIR STATUS fields of the devices 202, 204, 206, 208, 210 and 212 are compared to the scanned pattern "xxxxxxxxxxxxxxxx0001" in the PROM data registers 124. The codes stored in the CACHE REPAIR STATUS fields of the devices 202, 206 and 210 match the pattern "xxxxxxxxxxxxxxxx0001" scanned into the PROM data registers 124 of the devices 202, 206 and 210. However, the codes stored in the CACHE REPAIR STATUS fields of the devices 204, 208 and 212 do not match the pattern "xxxxxxxxxxxxxxxx0001" scanned into the PROM data registers 124 of the devices 204, 208 and 212.

In block 408, the devices that have matched the scanned pattern with their CACHE REPAIR STATUS fields execute the next set of TAP instructions that follow the scanned pattern and the devices that have not matched the scanned pattern with their CACHE REPAIR STATUS fields ignore the next set of TAP instructions that follow the scanned pattern. In one embodiment of the present invention, the devices 202, 206 and 210 execute the next set of TAP instructions that follow the scanned pattern because in this embodiment the pattern "xxxxxxxxxxxxxxxx0001" matches the code stored in the CACHE REPAIR STATUS fields of the devices 202, 206 and 210. However, the devices 204, 208 and 212 ignore the next set of TAP instructions that follow the scanned pattern because in this embodiment the pattern "xxxxxxxxxxxxxxxx0001" does not match the codes stored in the CACHE REPAIR STATUS fields of the devices 204, 208 and 212.

In a block 410, a new pattern can be scanned into the TAP instruction register of the devices under test in parallel through their TAP ports 101. For example, a new TAP instruction may be scanned. In this case, the operation flow returns to block 402 to scan in another pattern into the PROM Data Registers of the devices under test. For example, the pattern "xxxxxxxx1000xxxxxxxx" can be scanned via the TDI pin. Note that the scanned pattern "xxxxxxxx1000xxxxxxxx" corresponds to the pattern stored in the BUS RATIO fields of the devices 204, 208 and 212, with the operations of blocks 402–408 being repeated for the new scanned instruction and pattern.

Figure 4A:
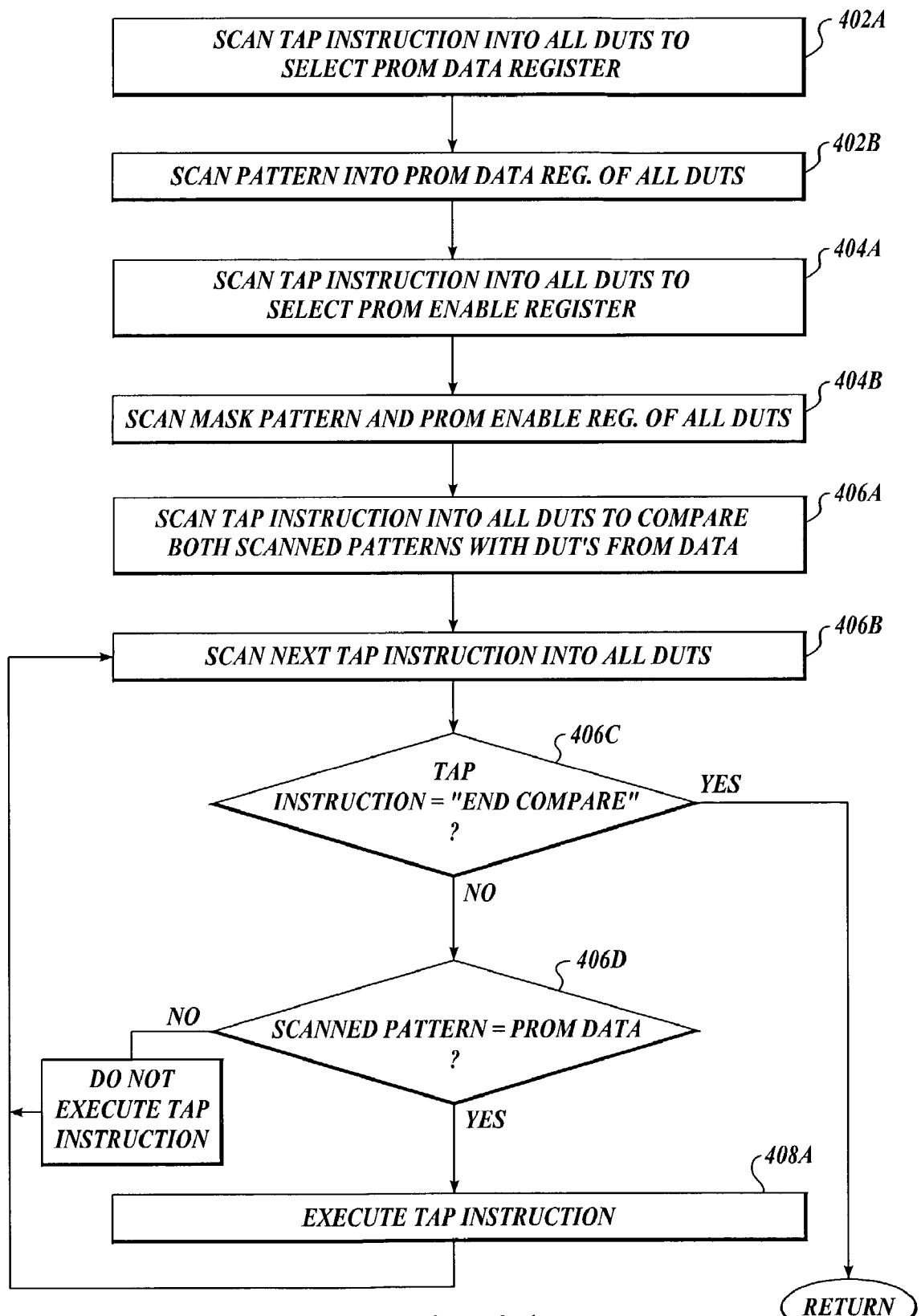
FIG. 4A is a flowchart illustrating the approach of FIG. 4 in more detail, according to one embodiment of the present invention.

FIG. 4A is a flowchart showing process 400 (FIG. 4) in more detail, according to one embodiment of the present invention. In this embodiment, all of the devices under test are connected in parallel. Referring to FIGS. 1, 2 and 4A, this embodiment of process 400 is performed as follows.

In a block 402A, a TAP instruction is scanned into TAP instruction register 104 of each device under test. In this embodiment, this instruction is to configure each device under test to select its PROM data register 124 for loading.

In a block 402B, a pattern is scanned into the PROM Data register 124 of each device under test. This pattern corresponds to the DEVICE ID of the particular device to be tested.

In a block 404A, another TAP instruction is scanned into TAP instruction register 104 of each device under test. In this embodiment, this instruction is to configure each device under test to select its PROM Enable register 122 for loading.

In a block 404B, a pattern is scanned into the PROM Enable register 122 of each device under test. This pattern corresponds to the mask pattern defining which bits of other fields of the PROM data to be compared.

In a block 406A, a TAP instruction is scanned into the instruction register 104 of each device under test. In this embodiment, the instruction is to compare the pattern scanned into the PROM Enable and PROM Data registers 122 and 124 with the data stored in a device's PROM Data Registers 110–118. In this embodiment, this instruction is then executed and if the scanned patterns match the device's data, the match signal on match signal line 150 is asserted.

In a block 406B, a next TAP instruction is scanned into the instruction register 104 of each device under test. For example, this next TAP instruction can cause the desired device under test to perform a selected test operation.

In a block 406C, the TAP instruction (from block 406B) is examined. If this TAP instruction is an "END COMPARE" instruction, the operational flow proceeds to a RETURN operation. If not, the operational flow proceeds to a block 406D.

In block 406D, the scanned patterns in the PROM Enable and PROM Data Registers 122 and 124 are compared to the data stored in the PROM Data Registers 110–118. In this embodiment, instruction decode/control logic 106 performs this operation by detecting whether the match signal on match signal line 150 is asserted. If the match signal is not asserted, the operational flow loops back to block 406B without executing the TAP instruction (i.e., from the previously performed block 406B).

However, if the match signal is asserted, the operational flow proceeds to a block 408A. In block 408A, the device executes the TAP instruction (from the previously performed block 406B) stored in the instruction register 104. The operational flow then loops back to perform block 406B again. The operational flow from block 406B onwards is then repeated as described above.

Embodiments of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments of the present invention disclosed in the specification and the claims. Rather, the scope of the invention is to be determined entirely by the following claims, which are to be construed in accordance with established doctrines of claim interpretation.

What is claimed is:

1. A Joint Test Access Group (JTAG) compatible integrated circuit to be tested, comprising:
   a test access port (TAP);
   a TAP instruction execution disabling logic coupled to the TAP;
   a non-volatile memory having a first code stored therein, wherein the first code comprises at least one field to identify a first variable for the integrated circuit;
   a TAP data register coupled to receive a second code via the TAP, wherein the second code comprises at least one field to identify a second variable for the integrated circuit; and
   a comparison logic coupled to the non-volatile memory and the TAP data register, the comparison logic to compare the first code to the second code, the TAP instruction execution disabling logic to enable the integrated circuit to execute subsequently scanned TAP instructions if the first code matches the second code, and to enable the integrated circuit to ignore subsequently scanned TAP instructions if the first code does not match the second code.

2. The integrated circuit of claim 1, wherein the non-volatile memory includes a dedicated programmable read only memory (PROM).

3. The integrated circuit of claim 2, wherein the non-volatile memory includes a dedicated erasable PROM (EPROM).

4. The integrated circuit of claim 1, wherein the non-volatile memory includes a dedicated fuse array.

5. The integrated circuit of claim 1, wherein the non-volatile memory includes a dedicated Flash memory.

6. The integrated circuit of claim 1, wherein the comparison logic includes an XOR gate.

7. The integrated circuit of claim 1, wherein the comparison logic includes an arithmetic logic unit (ALU).

8. The integrated circuit of claim 1, wherein the first code includes at least one field to identify at least one integrated circuit.

9. The integrated circuit of claim 8, wherein the first code includes at least one field to identify a class of integrated circuit.

10. The integrated circuit of claim 1, wherein the first code includes at least one field to identify a configuration for an integrated circuit.

11. A method, comprising:
   storing a first code in dedicated non-volatile memory of a Joint Test Access Group (JTAG) compatible integrated circuit to be tested;
   scanning a second code into a dedicated data register through a test access port (TAP) on the integrated circuit; and
   comparing the first code to the second code, executing subsequently scanned TAP instructions if the first code matches the second code, and ignoring subsequently scanned TAP instructions if the first code does not match the second code,
   wherein storing a first code comprises storing at least one field to identify a variable for the integrated circuit.

12. The method of claim 11, wherein storing a first code in dedicated non-volatile memory of an integrated circuit comprises storing a first code in a programmable read only memory (PROM).

13. The method of claim 11, wherein storing a first code in dedicated non-volatile memory of an integrated circuit comprises storing a first code in a fuse array.

14. The method of claim 12, wherein storing a first code in dedicated non-volatile memory of an integrated circuit comprises storing a first code in an erasable PROM (EPROM).

15. The method of claim 11, storing a first code in dedicated non-volatile memory of an integrated circuit comprises storing a first code in Flash memory.

16. The method of claim 11, wherein storing a first code comprises storing at least one field to identify an integrated circuit.

17. The method of claim 16, wherein storing a first code comprises storing at least one field to identify a type of integrated circuit.

18. The method of claim 17, wherein storing at least one field to identify a class of integrated circuit comprises storing at least one field to identify at least one of a microprocessor, a microcontroller, a programmable logic display (PLD), a static random access memory (SRAM), a field programmable gate array (FPGA), or an application specific integrated circuit (ASIC).

19. A system, comprising:
   a Joint Test Action Group (JTAG) tester; and
   at least two Joint Test Access Group (JTAG) compatible integrated circuits to be tested. each having a test access port (TAP), TAP instruction execution disabling logic coupled to the TAP, dedicated non-volatile memory having a first code stored therein, a dedicated TAP data register coupled to receive a second code via the TAP, and a comparison logic coupled to the dedicated non-volatile memory and the TAP data register, wherein the first code comprises at least one field to identify a variable for the at least two integrated circuits, wherein the comparison logic is to compare the first code to the second code, wherein the first and the second integrated circuits are to execute subsequently scanned TAP instructions if the first code matches the second code and to ignore subsequently scanned TAP instructions if the first code does not match the second code.

20. The system of claim 19, wherein the dedicated non-volatile memory includes a fuse array.

21. The system of claim 19, wherein the dedicated non-volatile memory includes a programmable read only memory (PROM).

22. The integrated circuit of claim 21, wherein the dedicated non-volatile memory includes an erasable PROM (EPROM).

23. An apparatus, comprising:
   means for storing a first code in dedicated non-volatile memory of an integrated circuit, wherein the first code comprises at least one field to identify an operational frequency for the integrated circuit;
   means for scanning a second code into a dedicated data register through a test access port (TAP) on the integrated circuit; and
   means for comparing the first code to the second code, executing subsequently scanned TAP instructions if the first code matches the second code, and ignoring subsequently scanned TAP instructions if the first code does not match the second code.

24. The apparatus of claim 23, wherein the means for storing a first code is for storing at least one field to identify an integrated circuit.

25. The apparatus of claim 24, wherein the at least one field is to identify a type of integrated circuit.

26. The apparatus of claim 24, wherein storing a first code comprises storing at least one field to identify a configuration for an integrated circuit.

* * * * *